(12) United States Patent
Lee (10) Patent No.: US 9,013,932 B1
(45) Date of Patent: Apr. 21, 2015

(54) SEMICONDUCTOR DEVICES AND SEMICONDUCTOR SYSTEMS INCLUDING THE SAME

(71) Applicant: SK Hynix Inc., Icheon-si Gyeonggi-do (KR)

(72) Inventor: Sang Hoon Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/206,790

(22) Filed: Mar. 12, 2014

(30) Foreign Application Priority Data

Nov. 6, 2013 (KR) .......................... 10-2013-0134312

(51) Int. Cl.
| G11C 5/14 | (2006.01) |
| G11C 7/04 | (2006.01) |
| G11C 7/00 | (2006.01) |
| G11C 8/00 | (2006.01) |
| G11C 11/406 | (2006.01) |

(52) U.S. Cl.
CPC ................................ G11C 11/40626 (2013.01)

(58) Field of Classification Search
USPC .................... 365/189.09, 211, 222, 230.06
See application file for complete search history.

(56) References Cited

U.S. PATENT DOCUMENTS

| 6,453,218 | B1 * | 9/2002 | Vergis | 365/211 |
| 7,075,847 | B2 * | 7/2006 | Kim et al. | 365/222 |
| 7,272,063 | B1 * | 9/2007 | Egerer et al. | 365/211 |
| 7,583,553 | B2 * | 9/2009 | Mori | 365/222 |
| 7,701,796 | B2 * | 4/2010 | Kim | 365/222 |
| 8,050,113 | B2 * | 11/2011 | Byeon | 365/189.09 |
| 8,233,333 | B2 * | 7/2012 | Jeong | 365/189.09 |
| 8,547,759 | B2 * | 10/2013 | Kadowaki | 365/211 |
| 8,553,485 | B2 * | 10/2013 | Pyeon | 365/222 |
| 2010/0123510 | A1 | 5/2010 | Yoshikawa | |

FOREIGN PATENT DOCUMENTS

KR     1020060000097 A     1/2006

\* cited by examiner

*Primary Examiner* — Trong Phan
(74) *Attorney, Agent, or Firm* — William Park & Associates Patent Ltd.

(57) ABSTRACT

A semiconductor system includes a controller and a semiconductor device. The controller outputs offset signals whose level combination is controlled according to temperature code signals including information on an internal temperature. The semiconductor device generates the temperature code signals according to a level combination of the offset signals. Further, the semiconductor device controls a refresh cycle time determined by the level combination of the offset signals.

20 Claims, 7 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2013-0134312, filed on Nov. 6, 2013, in the Korean Intellectual Property Office, which is incorporated herein by reference in its entirety as set forth in full.

TECHNICAL FIELD

Embodiments of the present disclosure relate to semiconductor devices and semiconductor systems including the same.

BACKGROUND

In the electronics industry, highly integrated fast volatile memory devices such as high performance dynamic random access memory (DRAM) devices widely used as memory devices are increasingly in demand with the development of higher performance electronic systems such as personal computers or communication systems. In particular, when semiconductor devices such as the DRAM devices are employed in cellular phones or notebook computers, the semiconductor devices have to be designed to have an excellent low power consumption characteristic. Accordingly, a lot of efforts have been focused on reduction of an operating current and a standby current of the semiconductor devices.

A data retention characteristic of a DRAM cell including a single transistor and a single storage capacitor may be very sensitive to a temperature. Thus, it may be necessary to control operation conditions of internal circuit blocks in a semiconductor integrated circuit according to variation of circumferential temperature. For example, DRAM devices employed in mobile systems may be designed to control a refresh cycle time according to variation of circumferential temperature. Temperature sensors such as digital temperature sensor regulators (DTSRs) or analog temperature sensor regulators (ATSRs) have been widely used to control the operation conditions of semiconductor devices such as DRAM devices according to variation of circumferential temperature. These temperature sensors may detect a relatively high temperature and may control a refresh cycle time to reduce power consumption in a self-refresh mode. Further, the temperature sensors may monitor a circumferential temperature in a normal operation mode.

SUMMARY

According to an embodiment, a semiconductor system includes a controller and a semiconductor device. The controller may output offset signals whose level combination is controlled according to temperature code signals including information on an internal temperature. The semiconductor device may generate the temperature code signals according to a level combination of the offset signals. Further, the semiconductor device may control a refresh cycle time which is determined by the level combination of the offset signals.

According to an embodiment, a semiconductor device may include a decoder, a flag signal generator, a temperature code generator, a refresh cycle controller and an internal circuit. The decoder may decode offset signals to generate decoded signals. The flag signal generator may compare division voltage signals whose levels are controlled according to the decoded signals with a temperature voltage signal to generate flag signals. The temperature code generator may generate temperature code signals according to a level combination of the flag signals. The refresh cycle controller may generate a refresh signal including pulses whose generation moments are controlled by a level combination of the offset signals. The internal circuit may execute a refresh operation in response to the pulses of the refresh signal.

In an embodiment, a system may include: a processor; a chipset configured to couple with the processor; a first controller configured to receive a request provided from the processor through the chipset; and a memory device configured to receive the request and output data to the first controller, the first controller including: a second controller and a semiconductor device. The second controller may output offset signals whose level combination is controlled according to temperature code signals including information on an internal temperature. The semiconductor device may generate the temperature code signals according to a level combination of the offset signals. Further, the semiconductor device may control a refresh cycle time which is determined by the level combination of the offset signals.

DETAILED DESCRIPTION

Various embodiments will be described hereinafter with reference to the accompanying drawings. However, the embodiments described herein are for illustrative purposes only and are not intended to limit the scope of the description.

Figure 1:
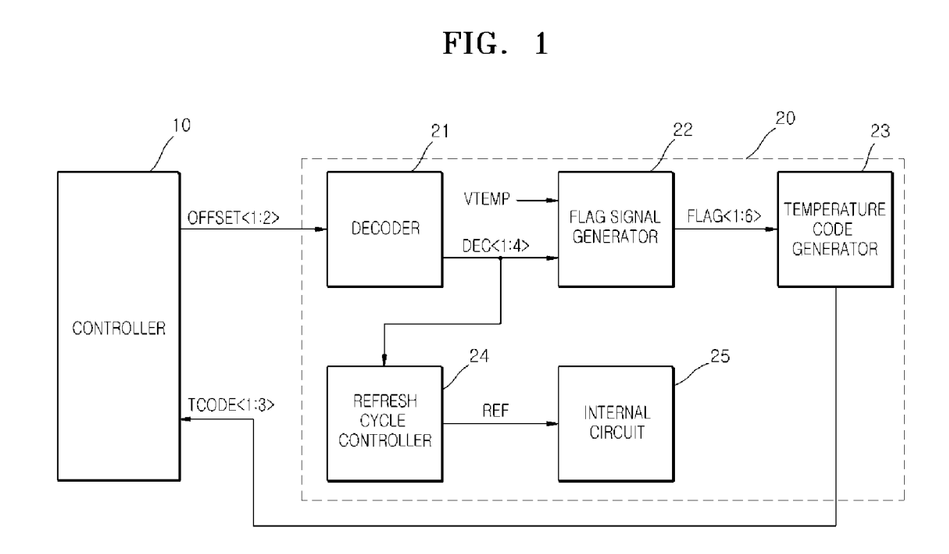
FIG. 1 is a block diagram illustrating a semiconductor system according to an embodiment.

Referring to FIG. 1, a semiconductor system according to an embodiment may include a controller 10 and a semiconductor device 20.

The controller 10 may receive first to third temperature code signals TCODE<1:3> including information on an internal temperature of the semiconductor device 20 to output first and second offset signals OFFSET<1:2>. A logic level combination of the first and second offset signals OFFSET<1:2> may be controlled according to a difference between an internal temperature of the controller 10 and an internal temperature of the semiconductor device 20.

Logic levels of the first and second offset signals OFFSET<1:2> set according to a difference between the internal temperature of the controller 10 and the internal temperature of the semiconductor device 20 may be set as listed in the following table 1 (i.e., H may represent a logic "high" level and L may represent logic "low" level). Although an embodiment is described in conjunction with the offset signals OFFSET<1:2> having two bits, the number of the offset signals is not limited to two. For example, in an embodiment, the number of the offset signals may be three or more. If the number of the offset signals increases, the internal temperature difference between the controller 10 and the semiconductor device 20 may be set with greater accuracy.

TABLE 1

| Internal Temperature Difference | OFFSET<2> | OFFSET<1> |
|---|---|---|
| 0° C. | L | L |
| 5° C. | L | H |
| 10° C. | H | L |
| 15° C. | H | H |

The semiconductor device 20 may include a decoder 21, a flag signal generator 22, a temperature code generator 23, a refresh cycle controller 24 and an internal circuit 25.

The decoder 21 may decode the first and second offset signals OFFSET<1:2> to generate first to fourth decoded signals DEC<1:4>, one of which is selectively enabled.

Logic levels of the first to fourth decoded signals DEC<1:4> generated in response to the first and second offset signals OFFSET<1:2> may be set as listed in the following table 2.

TABLE 2

| OFFSET<2> | OFFSET<1> | DEC<4> | DEC<3> | DEC<2> | DEC<1> |
|---|---|---|---|---|---|
| L | L | L | L | L | H |
| L | H | L | L | H | L |
| H | L | L | H | L | L |
| H | H | H | L | L | L |

The flag signal generator 22 may compare division voltage signals whose levels are controlled according to the first to fourth decoded signals DEC<1:4> with a temperature voltage signal VTEMP to generate first to sixth flag signals FLAG<1:6>. A level of the temperature voltage signal VTEMP may be lowered if the internal temperature of the semiconductor device 20 increases.

Levels of the first to sixth division voltage signals DIV<1:6> may be set to detect the internal temperature of the semiconductor device 20, and the internal temperatures corresponding to the first to sixth division voltage signals DIV<1:6> may be set as listed in the following table 3. In various embodiments, the internal temperatures corresponding to the first to sixth division voltage signals DIV<1:6> may be set to be different from what is shown in table 3.

TABLE 3

| Division Voltage Signal | Internal Temperature |
|---|---|
| DIV1 | 35° C. |
| DIV2 | 45° C. |
| DIV3 | 55° C. |
| DIV4 | 85° C. |
| DIV5 | 95° C. |
| DIV6 | 105° C. |

The temperature code generator 23 may generate the first to third temperature code signals TCODE<1:3> according to a logic level combination of the first to sixth flag signals FLAG<1:6>. The logic level combination of the first to sixth flag signals FLAG<1:6> may be determined according to the internal temperature of the semiconductor device 20.

When the internal temperature of the controller 10 is equal to the internal temperature of the semiconductor device 20, the logic levels of the first to third temperature code signals TCODE<1:3> according to the internal temperature may be set as listed in the following table 4. Although the embodiments are described in conjunction with the first to third temperature code signals TCODE<1:3> having three bits, the number of the temperature code signals is not limited to three. For example, in other embodiments, the number of the temperature code signals may be four or more. If the number of the temperature code signals increases, the information on the internal temperature of the semiconductor device 20 may be set with greater accuracy.

TABLE 4

| Internal Temperature | TCODE<3> | TCODE<2> | TCODE<1> |
|---|---|---|---|
| Over 105° C. | H | H | H |
| 96° C.-105° C. | H | H | L |
| 86° C.-95° C. | H | L | H |
| 56° C.-85° C. | H | L | L |
| 46° C.-55° C. | L | H | H |
| 36° C.-45° C. | L | H | L |
| Below 35° C. | L | L | H |

The refresh cycle controller 24 may generate a refresh signal REF whose pulse generation moment is adjusted by an amount of electric charges which is controlled according to the first to fourth decoded signals DEC<1:4>.

The internal circuit 25 may execute a refresh operation whenever the pulses of the refresh signal REF are inputted thereto.

A configuration of the flag signal generator 22 will be described more fully hereinafter with reference to FIG. 2.

Figure 2:
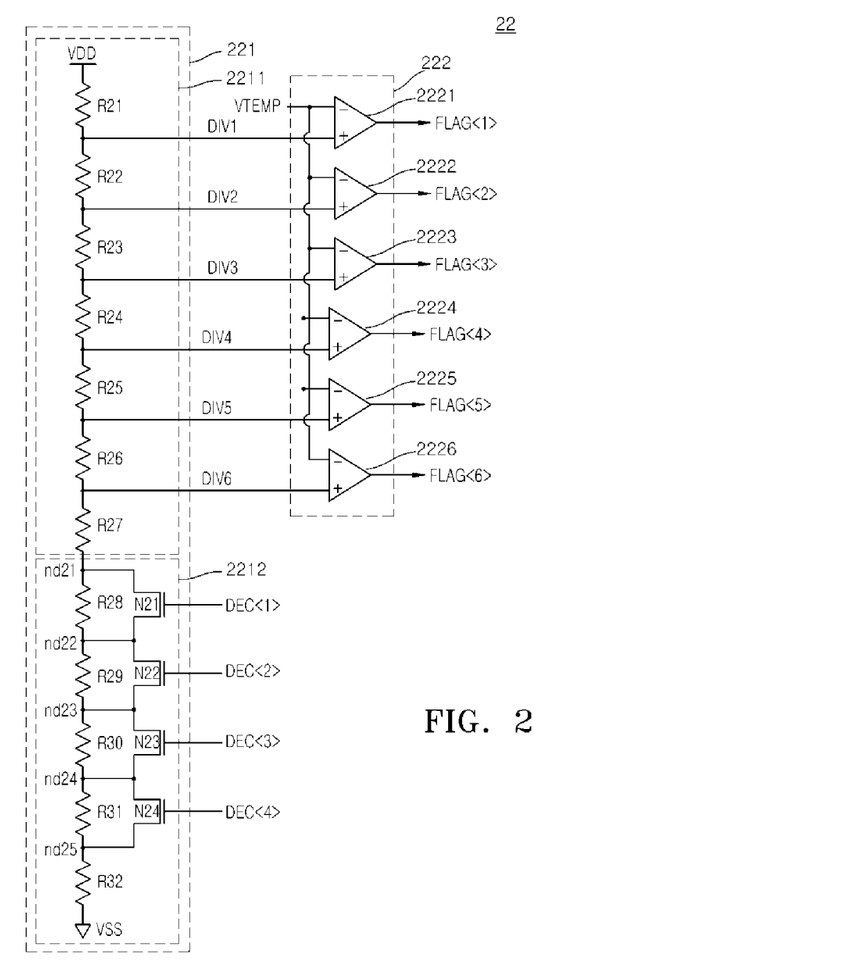
FIG. 2 is a circuit diagram illustrating a flag signal generator included in the semiconductor system of FIG. 1.

Referring to FIG. 2, the flag signal generator 22 may include a division voltage generator 221 and a comparator 222.

The division voltage generator 221 may include a voltage divider 2211 and a resistance controller 2212.

The voltage divider 2211 may generate first to sixth division voltage signals DIV1~DIV6 whose levels are divided by resistors R21, R22, R23, R24, R25, R26 and R27 which are serially coupled between a power supply voltage VDD terminal and a node ND21. The first division voltage signal DIV1 may be outputted through a node between the resistor R21 and the resistor R22, and the second division voltage signal DIV2 may be outputted through a node between the resistor R22 and the resistor R23. Further, the third division voltage signal DIV3 may be outputted through a node between the resistor R23 and the resistor R24, and the fourth division voltage signal DIV4 may be outputted through a node between the resistor R24 and the resistor R25. In addition, the fifth division voltage signal DIV5 may be outputted through a node between the resistor R25 and the resistor R26, and the sixth division voltage signal DIVE may be outputted through a node between the resistor R26 and the resistor R27. Resistance values of the resistors R21, R22, R23, R24, R25, R26 and R27 may be appropriately set to control levels of the first to sixth division voltage signals DIV1~DIV6.

The resistance controller 2212 may include a resistor R28 and a first switch element N21 coupled in parallel between the node ND21 and a node ND22, a resistor R29 and a second switch element N22 coupled in parallel between the node ND22 and a node ND23, a resistor R30 and a third switch element N23 coupled in parallel between the node ND23 and a node ND24, a resistor R31 and a fourth switch element N24 coupled in parallel between the node ND24 and a node ND25, and a resistor R32 coupled between the node ND25 and a ground voltage VSS terminal. The first switch element N21 may be turned on in response to the first decoded signal DEC<1> having a logic "high" level to provide a short circuit between the nodes ND21 and ND22, and the second switch element N22 may be turned on in response to the second decoded signal DEC<2> having a logic "high" level to provide a short circuit between the nodes ND22 and ND23. Similarly, the third switch element N23 may be turned on in response to the third decoded signal DEC<3> having a logic "high" level to provide a short circuit between the nodes ND23 and ND24, and the fourth switch element N24 may be turned on in response to the fourth decoded signal DEC<4> having a logic "high" level to provide a short circuit between the nodes ND24 and ND25. A resistance value of the resistor R28 may be set to be greater than a resistance value of the resistor R29, and the resistance value of the resistor R29 may be set to be greater than a resistance value of the resistor R30. Further, a resistance value of the resistor R30 may be set to be greater than a resistance value of the resistor R31. Accordingly, the resistance controller 2212 may control a voltage level of the node ND21 by changing a total resistance value between the node ND21 and the ground voltage VSS terminal according to logic levels of the first to fourth decoded signals DEC<1:4>.

The comparator 222 may include a first comparator 2221 generating a first flag signal FLAG<1> having a logic "high" level when a level of the first division voltage signal DIV1 is higher than a level of the temperature voltage signal VTEMP, a second comparator 2222 generating a second flag signal FLAG<2> having a logic "high" level when a level of the second division voltage signal DIV2 is higher than a level of the temperature voltage signal VTEMP, a third comparator 2223 generating a third flag signal FLAG<3> having a logic "high" level when a level of the third division voltage signal DIV3 is higher than a level of the temperature voltage signal VTEMP, a fourth comparator 2224 generating a fourth flag signal FLAG<4> having a logic "high" level when a level of the fourth division voltage signal DIV4 is higher than a level of the temperature voltage signal VTEMP, a fifth comparator 2225 generating a fifth flag signal FLAG<5> having a logic "high" level when a level of the fifth division voltage signal DIV5 is higher than a level of the temperature voltage signal VTEMP, and a sixth comparator 2226 generating a sixth flag signal FLAG<6> having a logic "high" level when a level of the sixth division voltage signal DIVE is higher than a level of the temperature voltage signal VTEMP.

An operation of the flag signal generator 22 will be described hereinafter with reference to FIG. 3 in conjunction with an example in which an internal temperature of the semiconductor device 20 is 50° C. and an internal temperature of the controller 10 is equal to an internal temperature of the semiconductor device 20 (i.e., an offset temperature is 0° C.) and an example in which an internal temperature of the semiconductor device 20 is 50° C. and an internal temperature of the controller 10 is higher than an internal temperature of the semiconductor device 20 by 10° C. (i.e., an offset temperature is 10° C.). In various embodiments, the internal temperature difference between the controller 10 and the semiconductor device 20 may be set to be different according to an internal operation of the semiconductor system or an external environment.

Figure 3:
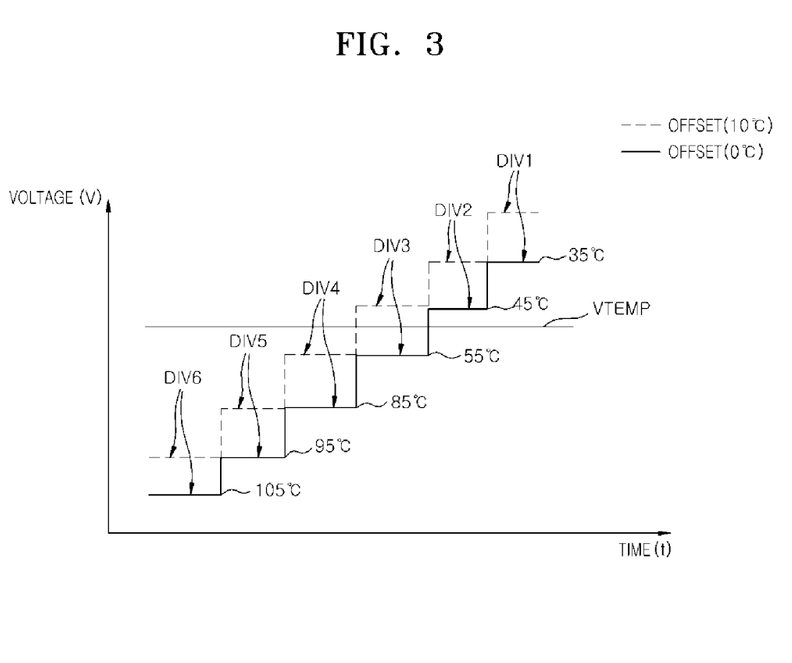
FIG. 3 is a graph illustrating an operation of the flag signal generator shown in FIG. 2.

First, when the internal temperature of the controller 10 is equal to the internal temperature of the semiconductor device 20 (i.e., the offset is 0° C.), voltage levels of the first to sixth division voltage signals DIV1~DIV6 may be set as indicated by a solid line of FIG. 3. In such a case, a voltage level of the first division voltage signal DIV1 may include information on the internal temperature of 35° C., a voltage level of the second division voltage signal DIV2 may include information on the internal temperature of 45° C., and a voltage level of the third division voltage signal DIV3 may include information on the internal temperature of 55° C. In addition, a voltage level of the fourth division voltage signal DIV4 may include information on the internal temperature of 85° C., a voltage level of the fifth division voltage signal DIV5 may include information on the internal temperature of 95° C., and a voltage level of the sixth division voltage signal DIVE may include information on the internal temperature of 105° C.

Thus, the temperature voltage signal VTEMP may be generated to have a voltage level which is lower than that of the second division voltage signal DIV2 and which is higher than that of the third division voltage signal DIV3. As a result, the first and second flag signals FLAG<1:2> may be generated to have a logic "high" level and the third to sixth flag signals FLAG<3:6> may be generated to have a logic "low" level.

Next, when the internal temperature of the controller 10 is higher than the internal temperature of the semiconductor device 20 by 10° C. (i.e., the offset is 10° C.), voltage levels of the first to sixth division voltage signals DIV1~DIV6 may be set as indicated by a dotted line of FIG. 3. In such a case, a voltage level of the first division voltage signal DIV1 may include information on the internal temperature below 35° C., a voltage level of the second division voltage signal DIV2 may include information on the internal temperature of 35° C., and a voltage level of the third division voltage signal DIV3 may include information on the internal temperature of 45° C. In addition, a voltage level of the fourth division voltage signal DIV4 may include information on the internal temperature of 55° C., a voltage level of the fifth division voltage signal DIV5 may include information on the internal temperature of 85° C., and a voltage level of the sixth division voltage signal DIVE may include information on the internal temperature of 95° C.

Thus, the temperature voltage signal VTEMP may be generated to have a voltage level which is lower than that of the third division voltage signal DIV3 and which is higher than that of the fourth division voltage signal DIV4. As a result, the first to third flag signals FLAG<1:3> may be generated to have a logic "high" level and the fourth to sixth flag signals FLAG<4:6> may be generated to have a logic "low" level.

Accordingly, the division voltage generator 221 of the flag signal generator 22 may increase levels of the first to sixth division voltage signals DIV1~DIV6 when the internal temperature of the controller 10 is higher than that of the semiconductor device 20 by 10° C. as compared with the case that the internal temperature of the controller 10 is equal to the internal temperature of the semiconductor device 20. Further, the comparator 222 of the flag signal generator 22 may compare the first to sixth division voltage signals DIV1~DIV6 with the temperature voltage signal VTEMP to generate the first to sixth flag signals FLAG<1:6>.

A configuration of the refresh cycle controller 24 will be described more fully hereinafter with reference to FIG. 4.

Figure 4:
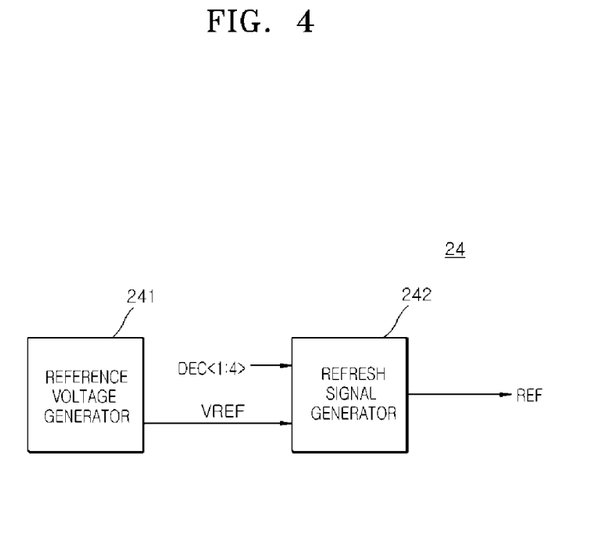
FIG. 4 is a block diagram illustrating a refresh cycle controller included in the semiconductor system of FIG. 1.

Referring to FIG. 4, the refresh cycle controller 24 may include a reference voltage generator 241 and a refresh signal generator 242.

The reference voltage generator 241 may generate a reference voltage signal VREF having a constant level regardless of variation of the internal temperature. In various embodiments, the reference voltage generator 241 may be realized using a Widlar voltage generation circuit or a band gap voltage generation circuit that generates a constant voltage level regardless of temperature variation.

The refresh signal generator 242 may compare a drive voltage signal DRV (see FIG. 5) whose level is adjusted by an amount of electric charges which is controlled according to the first to fourth decoded signals DEC<1:4> with the reference voltage signal VREF to generate the refresh signal REF including pulses.

A configuration of the refresh signal generator 242 will be described more fully hereinafter with reference to FIG. 5.

Figure 5:
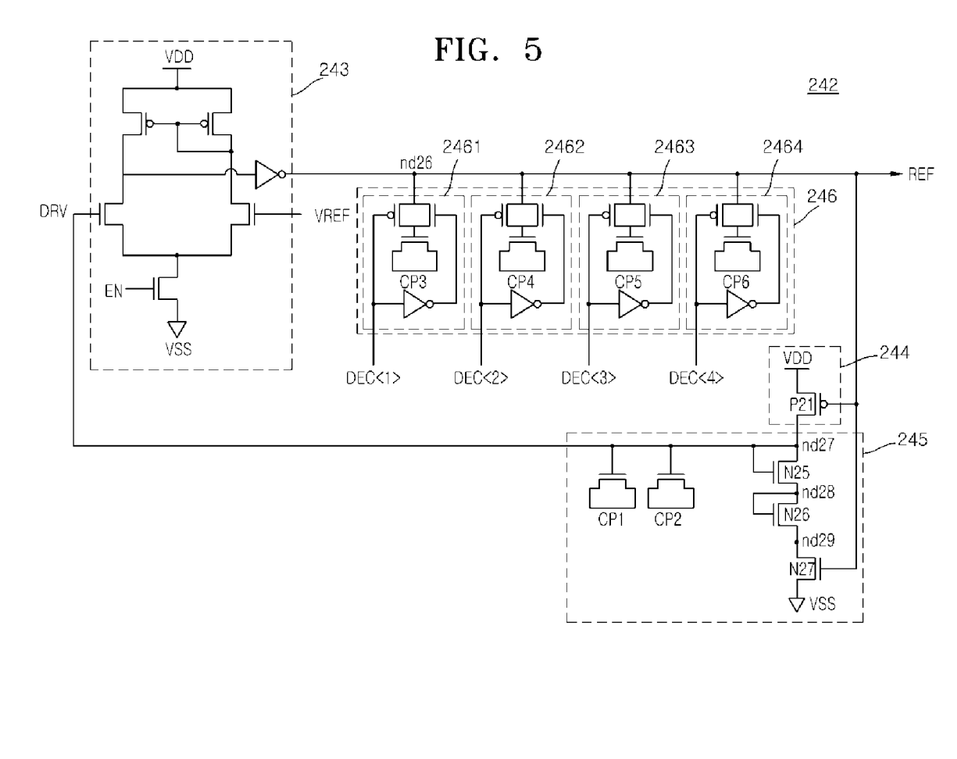
FIG. 5 is a circuit diagram illustrating a refresh signal generator included in the refresh cycle controller shown in FIG. 4.

Referring to FIG. 5, the refresh signal generator 242 may include a pulse generator 243, a charge supplier 244, a discharger 245 and a charge controller 246.

The pulse generator 243 may generate the refresh signal REF including a pulse which is created by driving a node ND26 when an enablement signal EN having a logic "high" level is inputted thereto and a voltage level of the drive signal DRV is higher than that of the reference voltage signal VREF.

The charge supplier 244 may be realized using a PMOS transistor P21 that is turned on to supply electric charges to a node ND27 when the refresh signal REF has a logic "low" level. That is, the charge supplier 244 may supply electric charges to the node ND27 to increase a voltage level of the drive signal DRV outputted through the node ND27 when the refresh signal REF has a logic "low" level.

The discharger 245 may include an NMOS transistor-type diode N25 that is coupled between the node ND27 and a node ND28 to discharge electric charges of capacitors CP1 and CP2 to the node ND28, an NMOS transistor-type diode N26 that is coupled between the node ND28 and a node ND29 to discharge electric charges of the node ND28 to the node ND29, and an NMOS transistor N27 that is coupled between the node ND29 and the ground voltage VSS terminal and is turned on to discharge electric charges of the node ND29 to the ground voltage VSS terminal when the refresh signal REF has a logic "high" level. That is, the discharger 245 may discharge the electric charges of the node ND27 to lower a voltage level of the drive signal DRV when the refresh signal REF has a logic "high" level.

The charge controller 246 may include a first charge controller 2461 that includes a capacitor CP3 which is connected to the node ND26 to control an amount of electric charges of the node ND26 when the first decoded signal DEC<1> has a logic "low" level, a second charge controller 2462 that includes a capacitor CP4 which is connected to the node ND26 to control an amount of electric charges of the node ND26 when the second decoded signal DEC<2> has a logic "low" level, a third charge controller 2463 that includes a capacitor CP5 which is connected to the node ND26 to control an amount of electric charges of the node ND26 when the third decoded signal DEC<3> has a logic "low" level, and a fourth charge controller 2464 that includes a capacitor CP6 which is connected to the node ND26 to control an amount of electric charges of the node ND26 when the fourth decoded signal DEC<4> has a logic "low" level. That is, the charge controller 246 may control a pulse generation moment of the refresh signal REF by controlling a electrical connection between the node ND26 and the capacitors CP3, CP4, CP5 and CP6 in response to the first to fourth decoded signals DEC<1:4> to control an amount of electric charges of the node ND26. A charge storage capacity of the capacitor CP6 may be greater than that of the capacitor CP5, and a charge storage capacity of the capacitor CP5 may be greater than that of the capacitor CP4. Further, a charge storage capacity of the capacitor CP4 may be greater than that of the capacitor CP3.

An operation of the refresh cycle controller 24 will be described hereinafter with reference to FIG. 6 in conjunction with an example in which the internal temperature of the controller 10 is equal to the internal temperature of the semiconductor device 20 (i.e., the offset is 0° C.) and an example in which the internal temperature of the controller 10 is higher than the internal temperature of the semiconductor device 20 by 10° C. (i.e., the offset is 10° C.).

Figure 6:
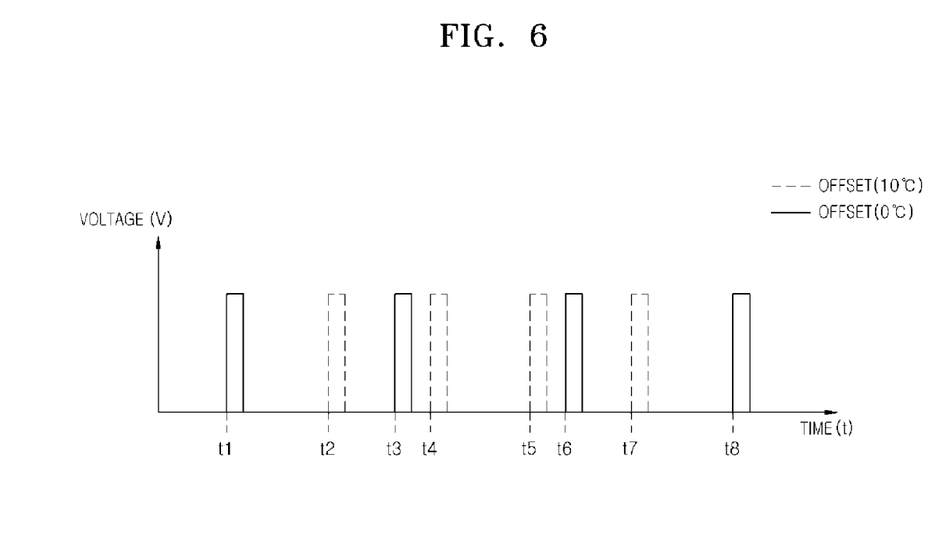
FIG. 6 is a timing diagram illustrating an operation of the refresh cycle controller shown in FIG. 4.

First, when the internal temperature of the controller 10 is equal to the internal temperature of the semiconductor device 20 (i.e., the offset is 0° C.), the pulses of the refresh signal REF may be generated as indicated by a solid line of FIG. 6. That is, when the internal temperature of the controller 10 is equal to the internal temperature of the semiconductor device 20 (i.e., the offset is 0° C.), the pulses of the refresh signal REF may be generated at points of time "t1", "t3", "t6" and "t8".

Next, when the internal temperature of the controller 10 is higher than the internal temperature of the semiconductor device 20 by 10° C. (i.e., the offset is 10° C.), the pulses of the refresh signal REF may be generated as indicated by a dotted line of FIG. 6. That is, when the internal temperature of the controller 10 is higher than the internal temperature of the semiconductor device 20 by 10° C. (i.e., the offset is 10° C.), the pulses of the refresh signal REF may be generated at points of time "t1", "t2", "t4", "t5", "t7" and "t8".

As a result, the pulses of the refresh signal REF may be generated four times from the point of time "t1" to the point of time "t8" when the internal temperature of the controller 10 is equal to the internal temperature of the semiconductor device 20 (i.e., the offset is 0° C.), and the pulses of the refresh signal REF may be generated six times from the point of time "t1" to the point of time "t8" when the internal temperature of the controller 10 is higher than the internal temperature of the semiconductor device 20 by 10° C. (i.e., the offset is 10° C.).

An operation for controlling a refresh cycle time of the semiconductor system having the aforementioned configuration will be described hereinafter with reference to FIGS. 1 to 6 in conjunction with an example in which an internal temperature of the semiconductor device 20 is 50° C. and the internal temperature of the controller 10 varies from 50° C. to 60° C.

First, the operation for controlling the refresh cycle time of the semiconductor system will be described hereinafter in conjunction with an example in which the internal temperature of the controller 10 is equal to the internal temperature of the semiconductor device 20.

Since the semiconductor device 20 has the internal temperature of 50° C., the first to third temperature code signals TCODE<1:3> may be generated to have a logic level combination 'L,H,H', as listed in the table 4. The logic level combination 'L,H,H' of the first to third temperature code signals TCODE<1:3> means that the first temperature code signal TCODE<1> has a logic "high(H)" level, the second temperature code signal TCODE<2> has a logic "high(H)" level, and the third temperature code signal TCODE<3> has a logic "low(L)" level.

The controller 10 may receive the first to third temperature code signals TCODE<1:3> having a logic level combination 'L,H,H' to generate the first and second offset signals OFFSET<1:2> having a logic level combination 'L,L' as listed in the table 1 because the internal temperature of the controller 10 is equal to the internal temperature of the semiconductor device 20. The logic level combination 'L,L' of the first and second offset signals OFFSET<1:2> means that the first offset signal OFFSET<1> has a logic "low(L)" level and the second offset signal OFFSET<2> has a logic "low(L)" level.

The decoder 21 of the semiconductor device 20 may decode the first and second offset signals OFFSET<1:2> to generate the first to fourth decoded signals DEC<1:4> having a logic level combination 'L,L,L,H', as listed in the table 2. The logic level combination 'L,L,L,H' of the first to fourth decoded signals DEC<1:4> means that the first, second, third and fourth decoded signals DEC<1:4> have a logic "high(H)" level, a logic "low(L)" level, a logic "low(L)" level and a logic "low(L)" level, respectively.

The resistance controller 2212 of the division voltage generator 221 may be set such that a total resistance value between the node ND21 and the ground voltage VSS terminal is a sum of resistance values of the resistors R29, R30, R31 and R32 because the first to fourth decoded signals DEC<1:4> have a logic level combination 'L,L,L,H'. The voltage divider 2211 may divide a voltage difference between the power supply voltage VDD terminal and the node ND21 to generate the first to sixth division voltage signals DIV1~DIV6.

The first comparator 2221 of the comparator 222 may compare the first division voltage signal DIV1 with the temperature voltage signal VTEMP to generate the first flag signal FLAG<1> having a logic "high" level, the second comparator 2222 may compare the second division voltage signal DIV2 with the temperature voltage signal VTEMP to generate the second flag signal FLAG<2> having a logic "high" level, the third comparator 2223 may compare the third division voltage signal DIV3 with the temperature voltage signal VTEMP to generate the third flag signal FLAG<3> having a logic "low" level, the fourth comparator 2224 may compare the fourth division voltage signal DIV4 with the temperature voltage signal VTEMP to generate the fourth flag signal FLAG<4> having a logic "low" level, the fifth comparator 2225 may compare the fifth division voltage signal DIV5 with the temperature voltage signal VTEMP to generate the fifth flag signal FLAG<5> having a logic "low" level, and the sixth comparator 2226 may compare the sixth division voltage signal DIVE with the temperature voltage signal VTEMP to generate the sixth flag signal FLAG<6> having a logic "low" level. The temperature voltage signal VTEMP may be generated to have a voltage level which is lower than that of the second division voltage signal DIV2 and higher than that of the third division voltage signal DIV3 because the semiconductor device 20 has an internal temperature of 50° C.

The temperature code generator 23 may receive the first flag signal FLAG<1> having a logic "high" level, the second flag signal FLAG<2> having a logic "high" level, the third flag signal FLAG<3> having a logic "low" level, the fourth flag signal FLAG<4> having a logic "low" level, the fifth flag signal FLAG<5> having a logic "low" level, and the sixth flag signal FLAG<6> having a logic "low" level to generate the first to third temperature code signals TCODE<1:3> having a logic level combination 'L,H,H', as listed in the table 4. The logic level combination 'L,H,H' of the first to third temperature code signals TCODE<1:3> means that the first, second and third temperature code signals TCODE<1:3> have a logic "high(H)" level, a logic "high(H)" level and a logic "low(L)" level, respectively.

The reference voltage generator 241 may generate the reference voltage signal VREF having a constant voltage level regardless of variation of the internal temperature.

The pulse generator 243 of the refresh signal generator 242 may compare the drive signal DRV with the reference voltage signal VREF to generate the refresh signal REF including periodic pulses. The charge supplier 244 may supply electric charges to the node ND27 to increase a voltage level of the drive signal DRV when the refresh signal REF has a logic "low" level. The discharger 245 may be turned on to discharge the electric charges of the capacitors CP1 and CP2 into the ground voltage VSS terminal through the diodes N25 and N26 when the refresh signal REF has a logic "high" level. The charge controller 246 may receive the first to fourth decoded signals DEC<1:4> having a logic level combination 'L,L,L,H' to electrically disconnect the capacitor CP3 of the first charge controller 2461 from the node ND26 and to electrically connect the capacitors CP4, CP5 and CP6 of the second to fourth charge controllers 2462, 2463 and 2464 to the node ND26. Thus, a generation cycle time of the pulses of the refresh signal REF may be controlled by a discharge time of the electric charges stored in the capacitors CP4, CP5 and CP6 of the second to fourth charge controllers 2462, 2463 and 2464.

The internal circuit 25 may perform a refresh operation when the refresh signal REF is inputted to thereto.

Next, the operation for controlling the refresh cycle time of the semiconductor system will be described hereinafter in conjunction with an example in which an internal temperature of the semiconductor device 20 is 50° C. and the internal temperature of the controller 10 varies from 50° C. to 60° C.

Since the semiconductor device 20 has the internal temperature of 50° C., the first to third temperature code signals TCODE<1:3> may be generated to have a logic level combination 'L,H,H', as listed in the table 4. The logic level combination 'L,H,H' of the first to third temperature code signals TCODE<1:3> means that the first temperature code signal TCODE<1> has a logic "high(H)" level, the second temperature code signal TCODE<2> has a logic "high(H)" level, and the third temperature code signal TCODE<3> has a logic "low(L)" level.

The controller 10 may receive the first to third temperature code signals TCODE<1:3> having a logic level combination 'L,H,H' to generate the first and second offset signals OFFSET<1:2> having a logic level combination 'H,L' as listed in the table 1 because the internal temperature of the controller 10 is higher than the internal temperature of the semiconductor device 20 by 10° C. The logic level combination 'H,L' of the first and second offset signals OFFSET<1:2> means that the first offset signal OFFSET<1> has a logic "low(L)" level and the second offset signal OFFSET<2> has a logic "high (H)" level.

The decoder 21 of the semiconductor device 20 may decode the first and second offset signals OFFSET<1:2> to generate the first to fourth decoded signals DEC<1:4> having a logic level combination 'L,H,L,L', as listed in the table 2. The logic level combination 'L,H,L,L' of the first to fourth decoded signals DEC<1:4> means that the first, second, third and fourth decoded signals DEC<1:4> have a logic "low(L)" level, a logic "low(L)" level, a logic "high(H)" level and a logic "low(L)" level, respectively.

The resistance controller 2212 of the division voltage generator 221 may be set such that a total resistance value between the node ND21 and the ground voltage VSS terminal is a sum of resistance values of the resistors R28, R29, R31 and R32 because the first to fourth decoded signals DEC<1:4> have a logic level combination 'L,H,L,L'. That is, the total resistance value between the node ND21 and the ground voltage VSS terminal when the internal temperature of the controller 10 is higher than the internal temperature of the semiconductor device 20 by 10° C. may be set to be greater than the total resistance value between the node ND21 and the ground voltage VSS terminal when the internal temperature of the controller 10 is equal to the internal temperature of the semiconductor device 20. This is because the resistance value of the resistor R30 is greater than the resistance value of the resistor R28. The voltage divider 2211 may divide a voltage difference between the power supply voltage VDD terminal and the node ND21 to generate the first to sixth division voltage signals DIV1~DIV6. The first to sixth division voltage signals DIV1~DIV6 when the internal temperature of the controller 10 is higher than the internal temperature of the semiconductor device 20 by 10° C. may be generated to have higher voltage levels than the first to sixth division voltage signals DIV1~DIV6 when the internal temperature of the controller 10 is equal to the internal temperature of the semiconductor device 20. This is because the voltage level of the node ND21 when the internal temperature of the controller 10 is higher than the internal temperature of the semiconductor device 20 by 10° C. is higher than the voltage level of the node ND21 when the internal temperature of the controller 10 is equal to the internal temperature of the semiconductor device 20.

The first comparator 2221 of the comparator 222 may compare the first division voltage signal DIV1 with the temperature voltage signal VTEMP to generate the first flag signal FLAG<1> having a logic "high" level, the second comparator 2222 may compare the second division voltage signal DIV2 with the temperature voltage signal VTEMP to generate the second flag signal FLAG<2> having a logic "high" level, the third comparator 2223 may compare the third division voltage signal DIV3 with the temperature voltage signal VTEMP to generate the third flag signal FLAG<3> having a logic "high" level, the fourth comparator 2224 may compare the fourth division voltage signal DIV4 with the temperature voltage signal VTEMP to generate the fourth flag signal FLAG<4> having a logic "low" level, the fifth comparator 2225 may compare the fifth division voltage signal DIV5 with the temperature voltage signal VTEMP to generate the fifth flag signal FLAG<5> having a logic "low" level, and the sixth comparator 2226 may compare the sixth division voltage signal DIVE with the temperature voltage signal VTEMP to generate the sixth flag signal FLAG<6> having a logic "low" level. The temperature voltage signal VTEMP may be generated to have a voltage level which is lower than that of the third division voltage signal DIV3 and higher than that of the fourth division voltage signal DIV4 because the semiconductor device 20 has an internal temperature of 50° C.

The temperature code generator 23 may receive the first flag signal FLAG<1> having a logic "high" level, the second flag signal FLAG<2> having a logic "high" level, the third flag signal FLAG<3> having a logic "high" level, the fourth flag signal FLAG<4> having a logic "low" level, the fifth flag signal FLAG<5> having a logic "low" level, and the sixth flag signal FLAG<6> having a logic "low" level to generate the first to third temperature code signals TCODE<1:3> having a logic level combination 'H,L,L'. The logic level combination 'H,L,L' of the first to third temperature code signals TCODE<1:3> means that the first, second and third temperature code signals TCODE<1:3> have a logic "low(L)" level, a logic "low(L)" level and a logic "high(H)" level, respectively.

The reference voltage generator 241 may generate the reference voltage signal VREF having a constant voltage level regardless of variation of the internal temperature.

The pulse generator 243 of the refresh signal generator 242 may compare the drive signal DRV with the reference voltage signal VREF to generate the refresh signal REF including periodic pulses. The charge supplier 244 may supply electric charges to the node ND27 to increase a voltage level of the drive signal DRV when the refresh signal REF has a logic "low" level. The discharger 245 may be turned on to discharge the electric charges of the capacitors CP1 and CP2 into the ground voltage VSS terminal through the diodes N25 and N26 when the refresh signal REF has a logic "high" level. The charge controller 246 may receive the first to fourth decoded signals DEC<1:4> having a logic level combination 'L,H,L,L' to electrically disconnect the capacitor CP5 of the third charge controller 2463 from the node ND26 and to electrically connect the capacitors CP3, CP4 and CP6 of the first, second and fourth charge controllers 2461, 2462 and 2464 to the node ND26. Thus, a generation cycle time of the pulses of the refresh signal REF may be controlled by a discharge time of the electric charges stored in the capacitors CP3, CP4 and CP6 of the first, second and fourth charge controllers 2461, 2462 and 2464. That is, the generation cycle time of the pulses of the refresh signal REF when an internal temperature difference between the controller 10 and the semiconductor device 20 is 10° C. may be reduced as compared with the generation cycle time of the pulses of the refresh signal REF when an internal temperature difference between the controller 10 and the semiconductor device 20 is 0° C.

The internal circuit 25 may perform a refresh operation when the refresh signal REF is inputted to thereto.

As described above, the semiconductor system according to the embodiments may compensate for a difference between the internal temperature of the controller 10 and the internal temperature of the semiconductor device 20 to control temperature code signals and a refresh cycle time.

The semiconductor system discussed above is particular useful in the design of memory devices, processors, and computer systems. For example, referring to FIG. 7, a block diagram of a system employing a memory controller in accordance with the embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 7:
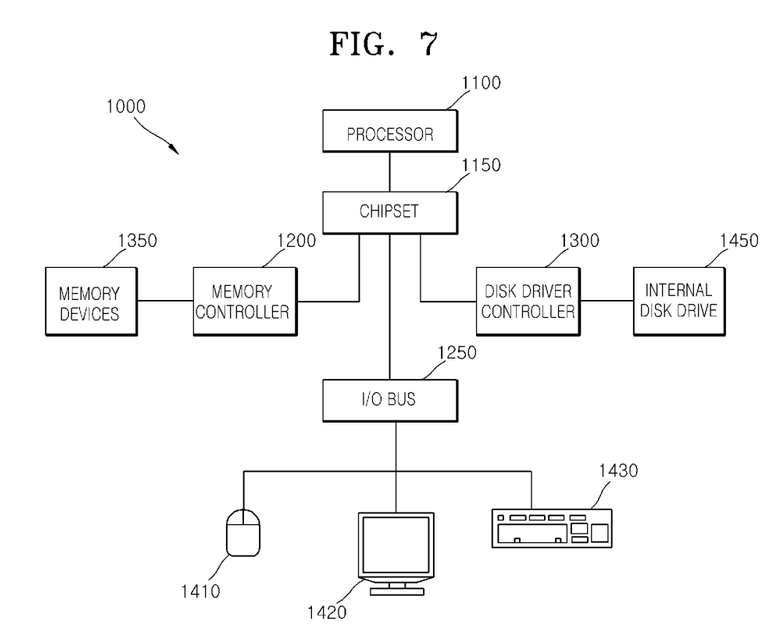
FIG. 7 illustrates a block diagram of a system employing the semiconductor system in accordance with the embodiments discussed above with relation to FIGS. 1-6.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor system discussed with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor system as discussed above with relation to FIGS. 1-6. In alternate embodiments, such as cellular phones or digital cameras, the components may differ from the embodiments shown in FIG. 7.

What is claimed is:

1. A semiconductor system comprising:
   a controller suitable for outputting offset signals whose level combination is controlled according to temperature code signals including information on an internal temperature; and
   a semiconductor device suitable for generating the temperature code signals according to a level combination of the offset signals and suitable for controlling a refresh cycle time which is determined by the level combination of the offset signals.

2. The semiconductor system of claim 1, wherein the level combination of the offset signals is controlled according to a difference between an internal temperature of the controller and an internal temperature of the semiconductor device.

3. The semiconductor system of claim 1, wherein the semiconductor device includes:
   a decoder suitable for decoding the offset signals to generate decoded signals, one of which is selectively enabled;
   a flag signal generator suitable for comparing division voltage signals whose levels are controlled according to the decoded signals with a temperature voltage signal to generate flag signals; and
   a temperature code generator suitable for generating the temperature code signals according to a level combination of the flag signals.

4. The semiconductor system of claim 3, wherein a voltage level of the temperature voltage signal varies according to an internal temperature of the semiconductor device.

5. The semiconductor system of claim 3, wherein the flag signal generator includes:
   a division voltage generator suitable for generating the division voltage signals whose voltage levels are controlled according to the decoded signals; and
   a comparator suitable for comparing the division voltage signals with the temperature voltage signal to generate the flag signals.

6. The semiconductor system of claim 5, wherein division voltage generator includes:
   a voltage divider suitable for including a plurality of resistors coupled in series between a power supply voltage terminal and a first node and suitable for dividing a voltage difference between the power supply voltage terminal and the first node to generate the division voltage signals; and
   a resistance controller suitable for controlling a resistance value thereof according to the decoded signals to control a voltage level of the first node.

7. The semiconductor system of claim 1, wherein the refresh cycle time of the semiconductor device is determined by an amount of electric charges that vary according to the level combination of the offset signals; and
   wherein the semiconductor device includes:
   a refresh cycle controller suitable for generating a refresh signal including pulses whose generation moments are controlled by the amount of electric charges which is set by a level combination of the offset signals; and
   an internal circuit suitable for executing a refresh operation in response to the pulses of the refresh signal.

8. The semiconductor system of claim 7, wherein the refresh cycle controller includes:
   a reference voltage generator suitable for generating a reference voltage signal having a constant level regardless of variation of a temperature; and
   a refresh signal generator suitable for comparing a drive voltage signal with the reference voltage signal to generate the refresh signal.

9. The semiconductor system of claim 8, wherein the refresh signal generator includes:
   a pulse generator suitable for driving a second node to generate the refresh signal including pulses which are created from the second node when a level of the drive signal is higher than a level of the reference voltage signal;
   a charge supplier suitable for supplying electric charges to a third node while no pulse of the refresh signal is created;
   a discharger suitable for discharging the electric charges of the third node to control a level of the drive signal; and
   a charge controller suitable for controlling an amount of electric charges of the second node according to a level combination of decoded signals.

10. The semiconductor system of claim 9, wherein the discharger includes:
    a capacitor suitable for being connected to the third node to store electric charges of the third node;
    a diode suitable for being coupled between the third node and a fourth node to discharge electric charges of the capacitor into the fourth node; and
    a switching element suitable for being coupled between the fourth node and a ground voltage terminal and suitable for discharging electric charges of the fourth node into the ground voltage terminal in response to the pulses of the refresh signal.

11. The semiconductor system of claim 9,
    wherein the decoded signals includes a first decoded signal and a second decoded signal; and
    wherein the charge controller includes:
    a first charge controller suitable for being turned on in response to the first decoded signal to control an amount of electric charges of the second node; and
    a second charge controller suitable for being turned on in response to the second decoded signal to control an amount of electric charges of the second node.

12. A semiconductor device comprising:
- a decoder suitable for decoding offset signals to generate decoded signals;
- a flag signal generator suitable for comparing division voltage signals whose levels are controlled according to the decoded signals with a temperature voltage signal to generate flag signals;
- a temperature code generator suitable for generating temperature code signals according to a level combination of the flag signals;
- a refresh cycle controller suitable for generating a refresh signal including pulses whose generation moments are controlled a level combination of the offset signals; and
- an internal circuit suitable for executing a refresh operation in response to the pulses of the refresh signal.

13. The semiconductor device of claim 12, wherein a level combination of the offset signals is controlled according to a difference between an internal temperature of an external device and an internal temperature of the semiconductor device.

14. The semiconductor device of claim 12, wherein a voltage level of the temperature voltage signal varies according to an internal temperature of the semiconductor device.

15. The semiconductor device of claim 12, wherein the flag signal generator includes:
- a division voltage generator suitable for generating the division voltage signals whose voltage levels are controlled according to the decoded signals; and
- a comparator suitable for comparing the division voltage signals with the temperature voltage signal to generate the flag signals.

16. The semiconductor device of claim 15, wherein division voltage generator includes:
- a voltage divider suitable for including a plurality of resistors coupled in series between a power supply voltage terminal and a first node and suitable for dividing a voltage difference between the power supply voltage terminal and the first node to generate the division voltage signals; and
- a resistance controller suitable for controlling a resistance value thereof according to the decoded signals to control a voltage level of the first node.

17. The semiconductor device of claim 12, wherein the refresh cycle controller includes:
- a reference voltage generator suitable for generating a reference voltage signal having a constant level regardless of variation of a temperature; and
- a refresh signal generator suitable for comparing a drive voltage signal with the reference voltage signal to generate the refresh signal.

18. The semiconductor device of claim 17, wherein the generation moments of the pulses of the refresh cycle controller are controlled by an amount of electric charges which are set by the level combination of the offset signals; and
wherein the refresh signal generator includes:
- a pulse generator suitable for driving a second node to generate the refresh signal including pulses which are created from the second node when a level of the drive signal is higher than a level of the reference voltage signal;
- a charge supplier suitable for supplying electric charges to a third node while no pulse of the refresh signal is created;
- a discharger suitable for discharging the electric charges of the third node to control a level of the drive signal; and
- a charge controller suitable for controlling an amount of electric charges of the second node according to a level combination of the decoded signals.

19. The semiconductor device of claim 18, wherein the discharger includes:
- a capacitor suitable for being connected to the third node to store electric charges of the third node;
- a diode suitable for being coupled between the third node and a fourth node to discharge electric charges of the capacitor into the fourth node; and
- a switching element suitable for being coupled between the fourth node and a ground voltage terminal and suitable for discharging electric charges of the fourth node into the ground voltage terminal in response to the pulses of the refresh signal.

20. The semiconductor device of claim 18,
wherein the decoded signals includes a first decoded signal and a second decoded signal; and
wherein the charge controller includes:
- a first charge controller suitable for being turned on in response to the first decoded signal to control an amount of electric charges of the second node; and
- a second charge controller suitable for being turned on in response to the second decoded signal to control an amount of electric charges of the second node.

* * * * *